US 6,741,442 B1

(12) United States Patent
McNally et al.

(10) Patent No.: US 6,741,442 B1
(45) Date of Patent: May 25, 2004

(54) INTELLIGENT POWER DISTRIBUTION SYSTEM

(75) Inventors: John McNally, Chicago, IL (US); Daniel Rohr, Fenton, MO (US)

(73) Assignee: American Power Conversion Corporation, West Kingston, RI (US)

( * ) Notice: Subject to any disclaimer, the term of this patent is extended or adjusted under 35 U.S.C. 154(b) by 372 days.

(21) Appl. No.: 09/688,298

(22) Filed: Oct. 13, 2000

(51) Int. Cl.[7] .............................................. H01H 47/00
(52) U.S. Cl. ........................ 361/166; 361/191; 307/41
(58) Field of Search ................................. 361/160, 166, 361/167, 191–193; 307/29, 38, 39, 41, 115, 125, 126, 141, 141.4, 143

(56) References Cited

U.S. PATENT DOCUMENTS

| | | | |
|---|---|---|---|
| 4,674,031 A | * | 6/1987 | Siska, Jr. ..................... 700/79 |
| 4,769,555 A | * | 9/1988 | Pequet et al. ................ 307/141 |
| 4,970,623 A | | 11/1990 | Pintar |
| 5,071,367 A | * | 12/1991 | Luu .............................. 439/501 |
| 5,424,903 A | * | 6/1995 | Schreiber ..................... 361/166 |
| 5,534,734 A | * | 7/1996 | Pugh et al. ................... 307/38 |
| 5,721,934 A | | 2/1998 | Scheurich |
| 5,901,067 A | | 5/1999 | Kao et al. |
| 5,923,103 A | * | 7/1999 | Pulizzi et al. ................ 307/126 |

* cited by examiner

Primary Examiner—Michael Sherry
Assistant Examiner—Gary L. Laxton
(74) Attorney, Agent, or Firm—Mintz, Levin, Cohn, Ferris, Glovsky and Popeo, P.C.

(57) ABSTRACT

An intelligent power distribution system including one or more intelligent power strips. The power strips can each include an elongated housing that may be adapted for mounting in an equipment rack. The housing can include a first end, a second end and plurality of power outlets mounted thereon. The first end can have a number of apertures that enable power and signal conductors to enter an interior region of the housing. The second end can include a first and a second communication port. The first communication port may be adapted to enable a computer to communicate with the power the strip. The second communication port may be adapted to enable the power the strip to be daisy chained with a second intelligent power strip. The power strip further includes power management circuitry that can power-on and power-off the power outlets in accordance with an operator defined sequence and delays. The power management circuitry can further sense electrical current drawn by the power strip and control operation of the power strip based on the sensed electrical current to minimize branch circuit breaker tripping.

26 Claims, 5 Drawing Sheets

INTELLIGENT POWER DISTRIBUTION SYSTEM

FIELD OF THE INVENTION

The present invention generally relates to an intelligent power distribution system and method, and more particularly to an intelligent power strip and method of distributing power in an electronic system.

BACKGROUND

Many electronic and electrical systems, such as computer and home entertainment systems, require that electrical power be applied to components of the system according to a particular sequence to avoid causing undue stress and possible damage to the components. Particularly with computer systems, there are many situations in which it is advantageous to delay activation of peripheral devices until after the parent device is powered up and has attained a quiescent state. A typical situation is that of a personal or business computer system where the activation of peripheral devices including a monitor, disk drives and printers, are delayed until after the computer itself is fully on-line. Upon activation of the parent device and after the parent device reaches a quiescent operating state, power can be applied to the peripheral devices. This sequence of powering up a computer system is especially helpful in eliminating undesirable transient currents and random logic states caused by simultaneous power up of the parent and peripheral devices.

For example, in many computer systems, power is first applied to the computer itself before power is applied to the monitor, because the computer supplies the monitor with horizontal and vertical synchronization pulses necessary to prevent the free running of the monitor's horizontal and vertical oscillators. Allowing the oscillators to operate in an unsynchronized condition can result in undue stress to the oscillators and hard failure of the monitor.

Similarly, power is applied to the computer before power is applied to the printer. Otherwise, the printer can potentially back-feed power or control signals to the computer and cause the computer to fail to initialize when the computer subsequently receives power. Consequently, the order and timing of the application of power to and removal of power from certain systems needs to be carefully controlled so as to avoid damaging the system components.

One solution for providing power to systems similar to that described above includes employing an operator to manually turn on the components. Specifically, the operator can power on the computer itself and pause momentarily to allow sufficient time for the computer to reach a quiescent operating state before providing power to the computer's peripheral devices. This method is generally unsatisfactory, because the time delay interval is difficult to control and duplicate manually, and further, because it may be desirable to ensure that the power up and power down of the system always occur according to a particular sequence.

Another solution is to use time delay relays ("TDRs") to provide a predetermined, fixed time delay between application of power to one component and the next. This method is also unsatisfactory, as well as being very expensive. TDRs are capable only of providing a fixed, or at best, a narrowly adjustable, time delay. Furthermore, the power up delay is typically equal to the power down delay, a condition which may be undesirable in certain cases. Finally, the time delay provided by the TDRs is typically not easy to adjust by an operator.

Therefore, a need exists for an intelligent power distribution system that can provide power up and/or power down sequences and delays for equipment, which overcomes limitations and deficiencies of the prior art.

SUMMARY OF THE INVENTION

It is an object of the present invention to provide an intelligent power distribution system and method for using the power distribution system. In embodiments of the present invention, the intelligent power distribution system can manage power consumption to minimize tripping of a branch circuit breaker which provides electrical power to the system.

In one aspect of the present invention, a power distribution system can include a plurality of intelligent power strips that can be adapted for mounting in an equipment rack. The power strips can be individually mounted and controlled or the power strips can be daisy chained together to form a scalable power strip which can be unitarily controlled. The equipment rack can have a number of slots that may be adapted to securely hold a number of pieces of equipment thereon.

Each intelligent power strip can include a housing that has a first end and a second end. A plurality of power outlets can be mounted on an exterior surface of the housing to provide power to the equipment. An aperture can be formed on the first end of the housing to enable power and signal conductors to access an interior region of the housing. A first communication port and a second communication port can be defined on the second end of the housing. The first communication port can include a communication-in circuit that enables bi-directional communication with the power strip and the second communication port can include a communication-out circuit that enables the power strip to be coupled to a second power strip.

The intelligent power strip can further include a power management circuit which is defined in the interior region of the housing. The power management circuit can include a current sensor circuit that may be adapted to receive alternating current ("AC") input power over an AC input power line. The current sensor circuit can be coupled to the power outlets as well as to an AC to direct current ("DC") power supply. The AC to DC power supply receives and processes AC power from the current sensor circuit to generate a plurality of DC voltage values.

The micro-controller can be coupled to the power supply and can receive one or more voltage values from the power supply. The micro-controller may be further coupled to a relay driver. The relay driver can receive control signals from the mico-controller to control a plurality of relays coupled to the relay driver. The relays can be coupled to the power outlets defined on the housing of the power strip. The relays can be controlled to a conductive state to power-on the power outlets and the relays can be controlled to a non-conductive state to power-off the power outlets.

The power outlets defined on the power strip can include a first group of power outlets and a second group of power outlets. The first group of power outlets can be coupled to the sensor circuit and the second group of power outlets can be coupled to the sensor circuit via the relays. The second group of power outlets can each include a light-emitting-diode ("LED") that can be controlled to illuminate to indicate that each power outlet is powered-on.

The power management circuit can further include an input power source sensor circuit. The input power source sensor circuit can be coupled intermediate the power supply and the micro-controller. The input power source sensor circuit can receive DC input power from the power supply that is hereinafter defined as primary DC input power, which can be provided to the micro-controller. The input power source sensor circuit can further receive secondary DC input power from a secondary power source. The secondary power source can be provided by the communication-in circuit and can provide a redundant power source for the mico-controller. In the event that the primary DC input power provided by the power supply fails or is unavailable, the input power source sensor circuit can provide the secondary DC input power to the micro-controller.

The micro-controller can be further coupled to an under voltage sensor. The under voltage sensor can be adapted to receive a predetermined voltage value from the power supply. The under voltage sensor can be responsive to the predetermined voltage value falling below a predetermined threshold value by providing a reset signal to the micro-controller. The predetermined threshold value can be defined by a user of the intelligent power distribution system.

A non-volatile memory device can also be coupled to micro-controller to enable the micro-controller to store initialization and configuration information as well as other operating parameters.

The micro-controller can also be coupled to an audible alarm that can alert an operator that current on the input power line has exceeded a predetermined threshold value. A mute button coupled to the micro-controller can be actuated to silence the audible alarm.

An overload LED, which is coupled to the micro-controller, can be controlled to illuminate with a predetermined frequency to indicate an overload status of the input power line.

In another aspect of the present invention, a power distribution method includes energizing an input power line to power-up a first group of power outlets on a power distribution system; and controlling a plurality of relays to actuate to a conductive state in accordance with a predetermined sequence and predetermined delay to sequentially power-on a second group of power outlets defined on the power distribution system. Powering-on the second group of power outlets further includes illuminating a light-emitting-diode associated with each power outlet, defined in the second group, to indicate a powered-on status of the second group of power outlets.

Initializing the power distribution system can include programming a normal-threshold value into the power distribution system; programing an overload-threshold value into the power distribution system; programming an under-voltage threshold value into the power distribution system; programming delays into the power distribution system, the delays can be related to powering-on and powering-off power outlets defined in the second group; and programming the sequence for which power outlets can be powered-on and powered-off.

The method can further include sensing current on the input power line; providing the sensed current to a micro-controller; and determining if the sensed current is below the normal-threshold value. If the sensed current is determined to be below the normal-threshold value then the method further includes indicating a normal operating status of the power distribution system.

The method can further include determining if the sensed current is above the normal-threshold value; and determining if the sensed current is below the overload-threshold value. If the sensed current is determined to be above the normal-threshold value and below the overload-threshold value, the method further includes indicating a high current status of the power distribution system.

The method can further include determining if the sensed current is above the overload-threshold value. If the sensed current is determined to be above the overload-threshold value, the method further includes indicating an alarm status of the power distribution system.

If the sensed current is determined to be above the normal-threshold value and below the overload-threshold value, the method further includes controlling a first group of predetermined relays to actuate to a non-conductive state to power-off a number of associated power outlets.

If the sensed current is determined to be above the overload-threshold value, the method further includes controlling a second group of predetermined relays to actuate to a non-conductive state to power-off a number of associated power outlets.

The method can further include controlling the plurality of relays to actuate to a non-conductive state in accordance with a predetermined sequence to sequentially power-off the second group of power outlets, which are coupled to the relays; and de-energizing the input power line defined on the power distribution system to power-off the first group of power outlets defined on the power distribution system.

BRIEF DESCRIPTION OF THE DRAWINGS

The foregoing and other objects of this invention, the various features thereof, as well as the invention itself, can be more fully understood from the following description when read together with the accompanying drawings in which.

DETAILED DESCRIPTION OF THE PREFERRED EMBODIMENTS

In the following detailed description of the present invention numerous specific details are set forth in order to provide a thorough understanding of the present invention. However, it will be obvious to one skilled in the art that the present invention may be practiced without these specific details. In other instances, well known methods, procedures, components, and circuits have not been described in detail as not to unnecessarily obscure aspects of the present invention.

In accordance with an embodiment of the present invention, an intelligent power strip is set forth that can provide electrical power and power management to one or more computer systems and their related peripheral devices. The power strip includes internal power management circuitry and external power outlets. The intelligent power strip can operate in conjunction with power management procedures, within the scope of the present invention, to provide a power management system for conventional computer systems. The power management system may be implemented on a general purpose computer system to provide that computer system with automatic and/or user programmable power management features.

Figure 1A:
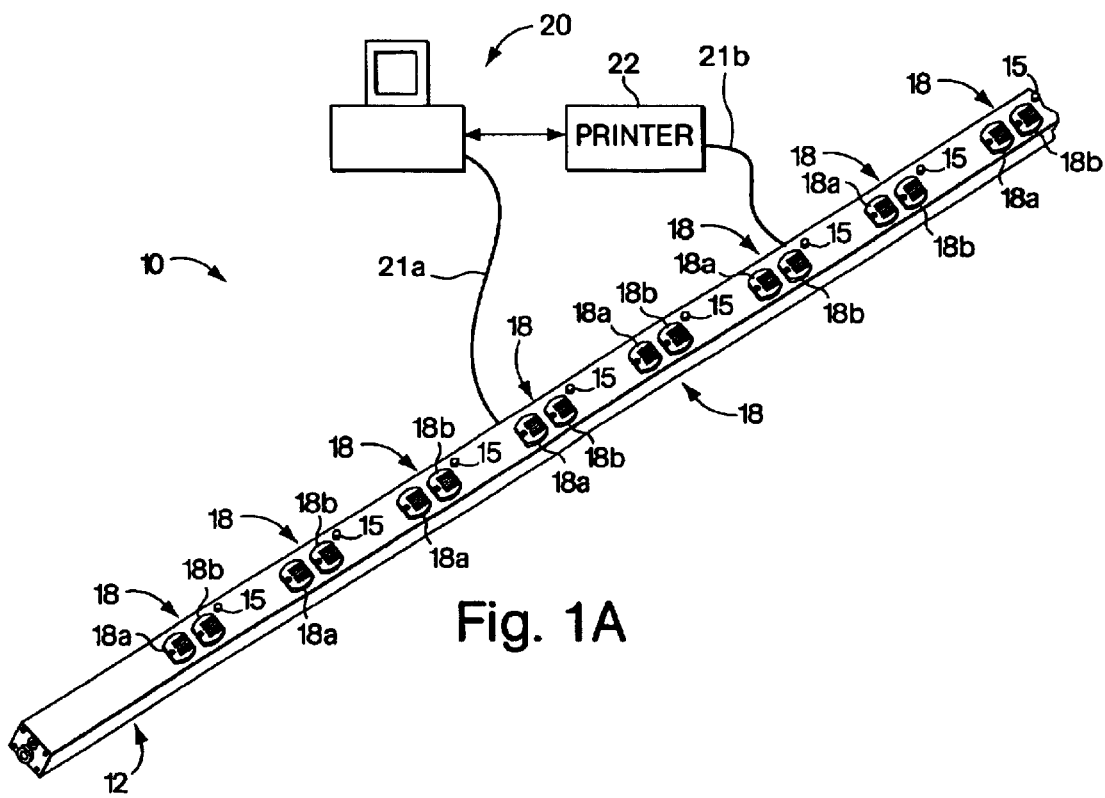
FIG. 1a is an intelligent power strip in accordance with an embodiment of the present invention.
Figure 1B:
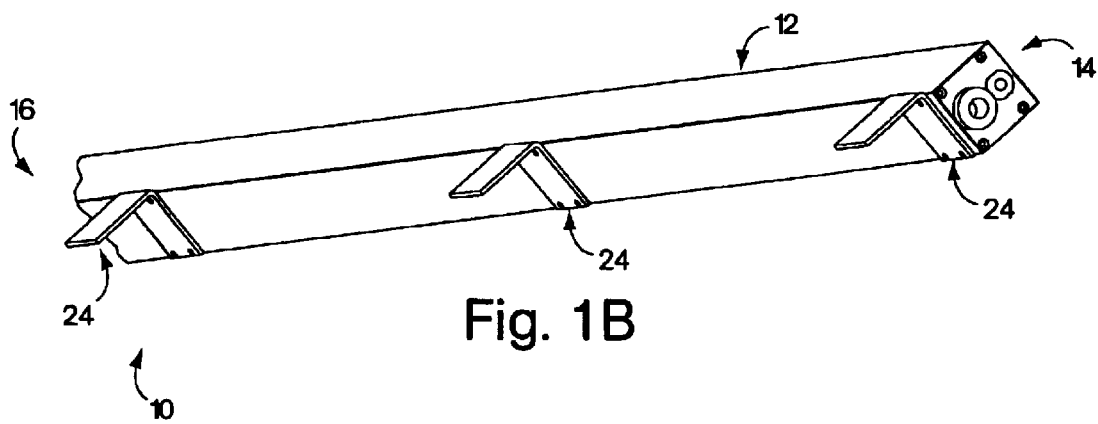
FIG. 1b is another view of the intelligent power strip shown in FIG. 1.
Figure 2A:
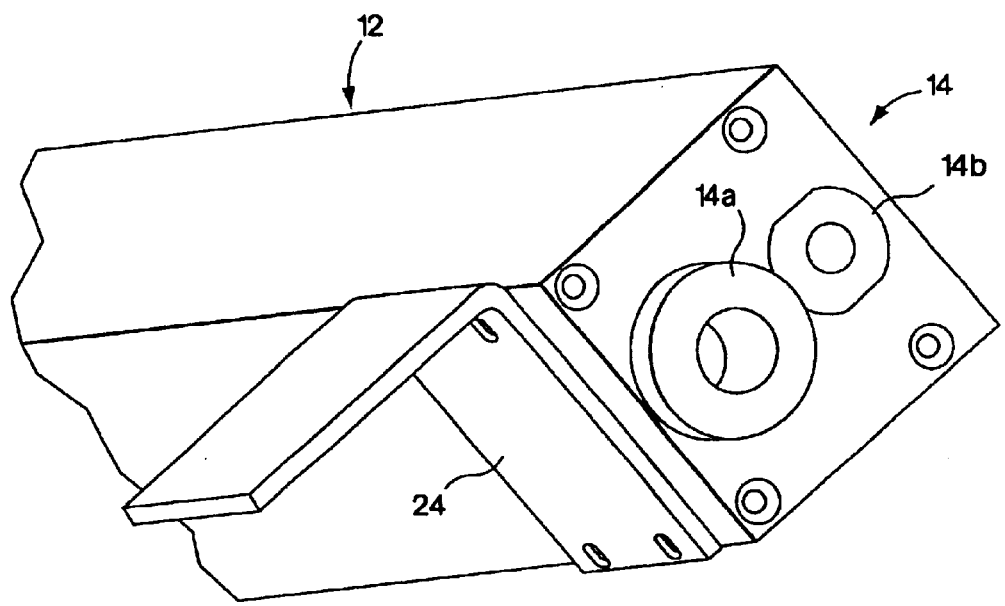
FIG. 2a is an enlarged view of a portion of the intelligent power strip shown in FIG. 1.
Figure 2B:
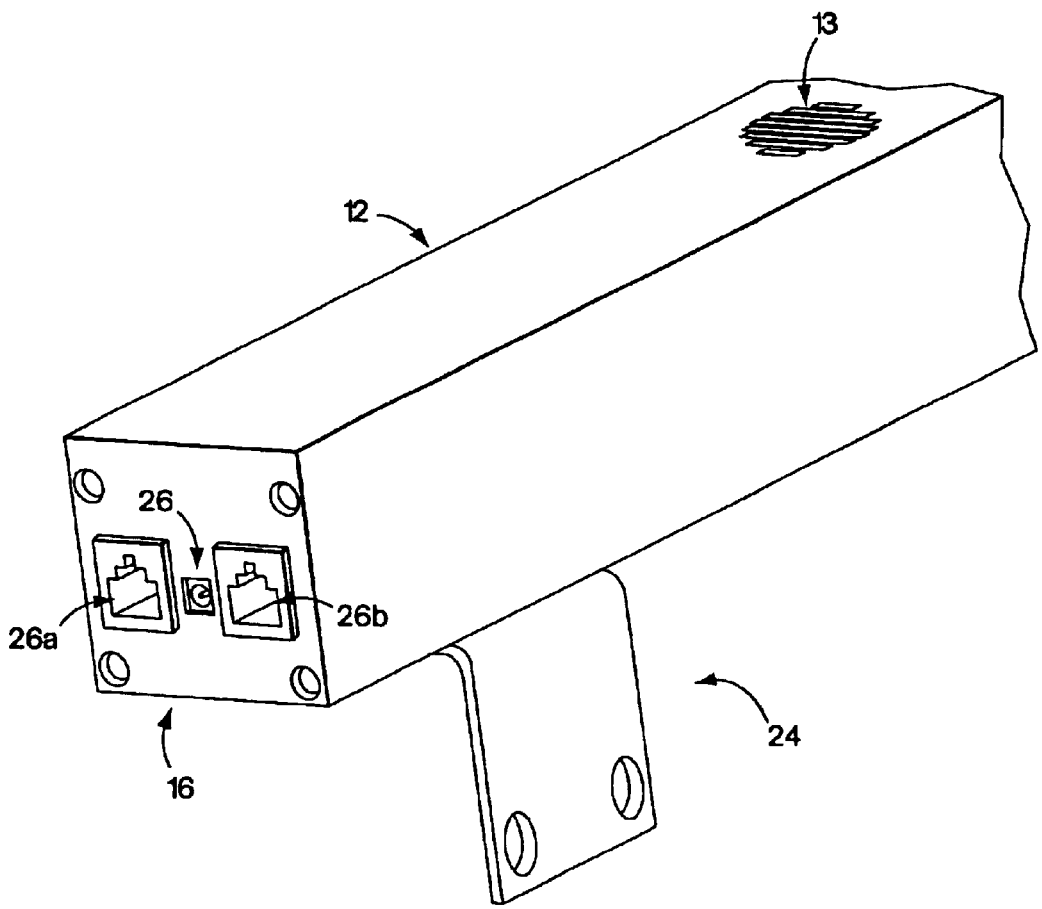
FIG. 2b is an enlarged view of another portion of the intelligent power strip shown in FIG. 1.
Figure 3:
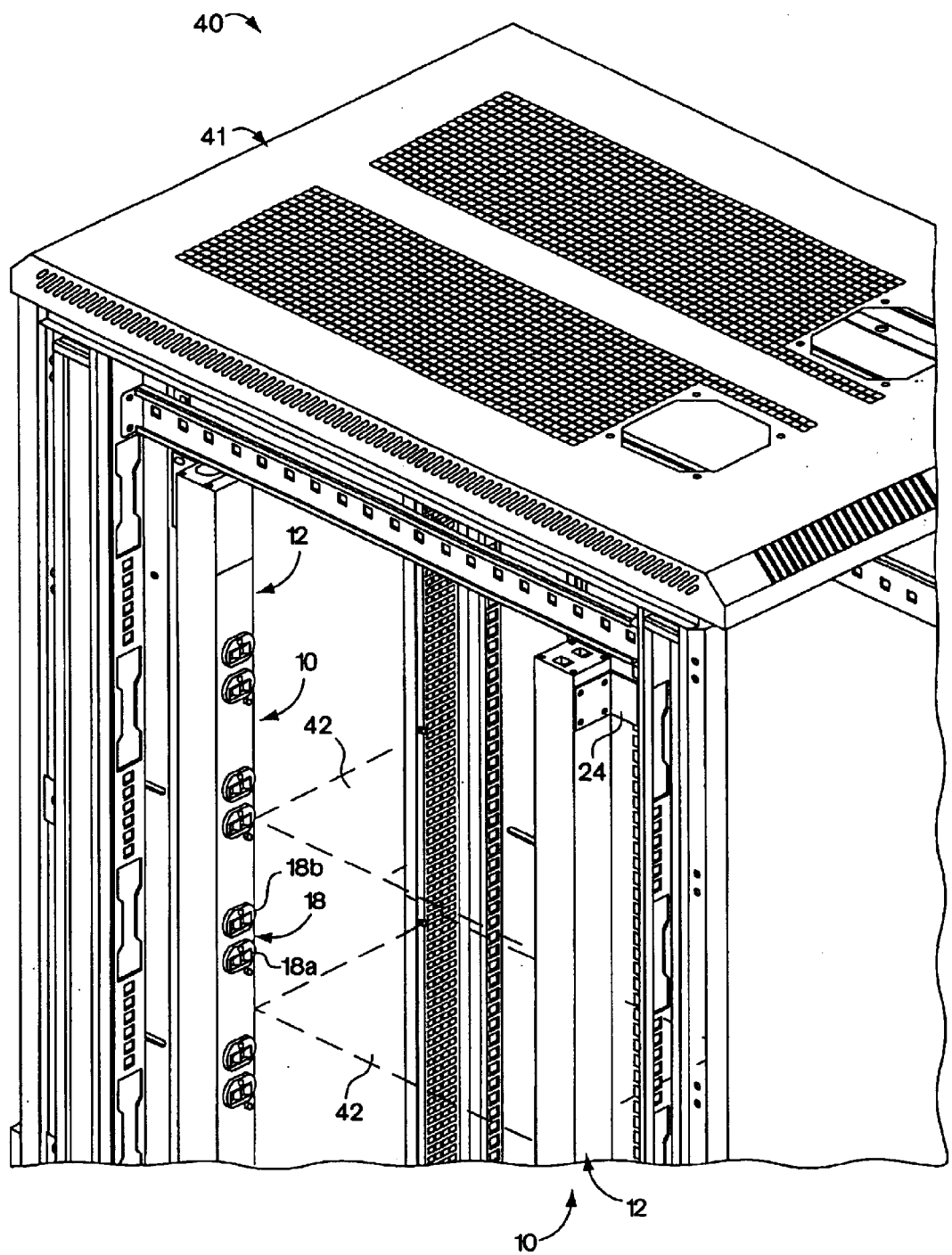
FIG. 3 is a power distribution system which includes the intelligent power strip shown in FIG. 1.

Referring to FIGS. 1a, 1b, 2a, 2b and 3, in one specific embodiment, the intelligent power strip includes an elongated rectangular housing 12, which has a first end 14 and a second end 16. The housing 12 can further include a plurality of externally accessible AC power outlets 18, through which one or more computers 20 and their related peripherals 22 receive power. The power outlets 18 can be mounted along a longitudinal length of one face of the housing 12. A number of mounting brackets 24 can be coupled to the housing 12 to enable the housing to be mounted to an equipment rack 41 as shown in FIG. 3. The first end 14 of the housing 12 can include a number of apertures 14 which may be adapted to permit power and signal conductors to enter an internal region of the housing 12. The second end 16 of the housing 12 can include a plurality of externally accessible communication ports 26. In an embodiment, a first communication ports 26a is adapted to permit an external control device, such as computer system 20, to communicate with the power management circuitry 50 (FIG. 4) defined in the housing 12. A second communication port 26b, defined on the second end 16 of the housing 12, is adapted to permit the power management circuitry 50 to communicate with one or more external devices. The external devices may be one or more intelligent power strips 10, which can be daisy chained together.

In an embodiment, a power distribution system 40 can include a plurality of power strips 10 which may be individually operated or which may be daisy chained together as previously described. The power strips can be mounted in the equipment rack 41. The equipment rack 41 can include a number of slots 42, which are adapted to securely hold a number of pieces of equipment (not shown) thereon.

Figure 4:
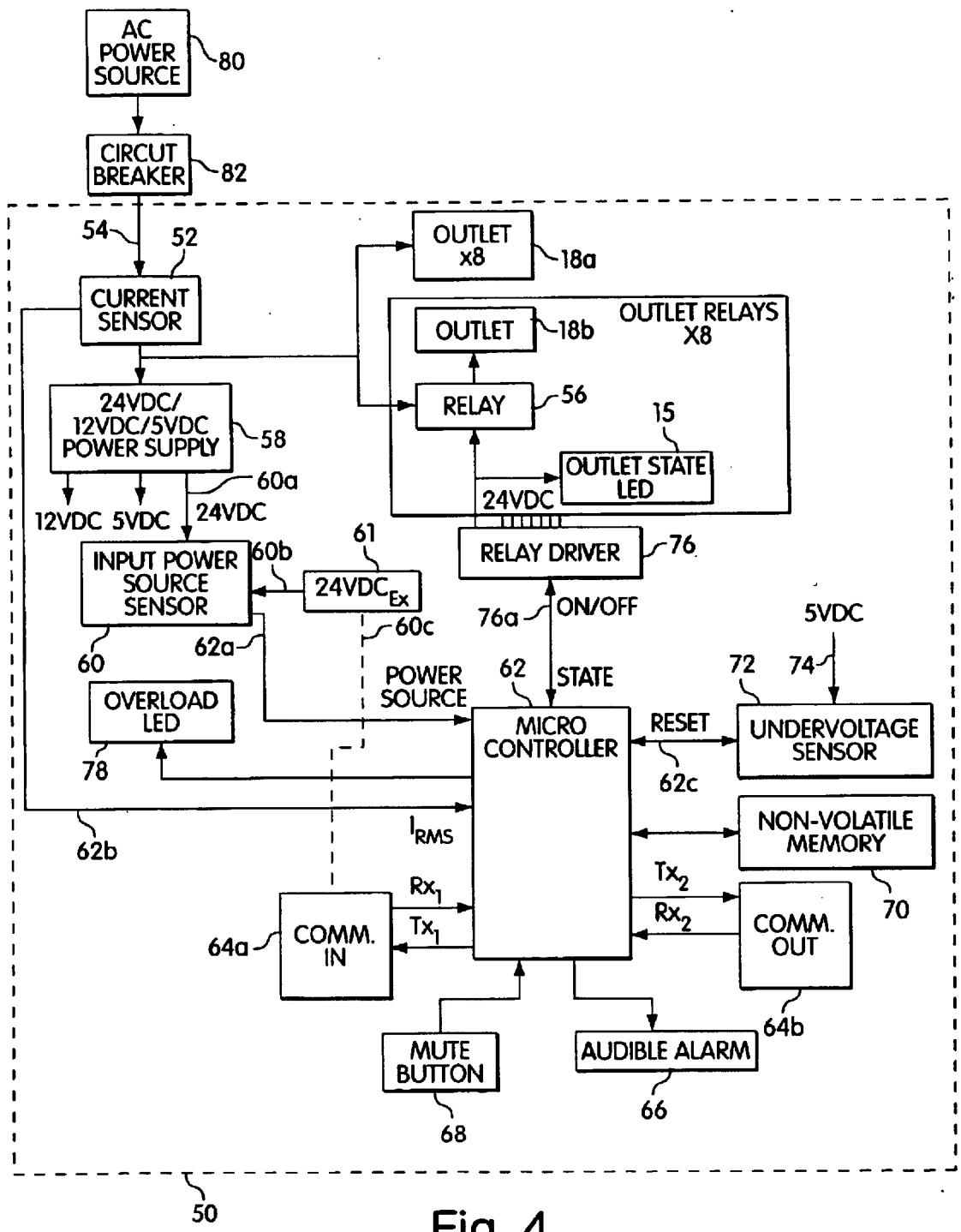
FIG. 4 is a schematic block diagram of power management circuitry which is included in the intelligent power strip shown in FIG. 1.

Referring further to FIG. 4, the power management circuitry 50, which is positioned in the interior region of the housing 12 of the power strip 10, includes a current sensor circuit 52. The current sensor circuit 52 receives AC input power over an AC input power line 54 from an AC power source 80 through branch circuit breaker 82.

The power outlets 18 defined on the power strip can include a first group of power outlets 18a and a second group of power outlets 18b. The first group of power outlets 18a can be coupled to the current sensor circuit and can be defined as constant power outlets. The first group of power outlets 18a can remain energized as long as power is provided to the power strip 10 by the AC power source 80 over input power line 54. Each outlet, defined in the second group of power outlets 18b, can be coupled to the current sensor circuit via an associated relay 56. The second group of power outlets 18b can remain energized as long as the relay 56 associated with each outlet is actuated to a conductive state.

The current sensor circuit 52 is further coupled to an AC to DC power supply 58 which can provide a plurality of DC voltage values to power other components of the power strip 10. The AC to DC power supply 58 can be coupled to an input power source sensor circuit 60 which is further coupled to a micro-controller 62.

The input power source sensor circuit 60 is adapted to receive primary DC input power over power line 60a from the AC to DC power supply 58. The input power source sensor circuit 60 is further adapted to receive secondary DC input power from a secondary source 61. The secondary source can include a DC power line 60c provided by the communication-in circuitry 64a, which will be described in further detail below. In an embodiment, the primary and secondary DC input power can include a 24-volt DC input voltage level.

The input power source sensor circuit 60 normally operates from the primary DC input power, which is provided by the AC to DC power supply 58. The input power source sensor circuit 60 further provides the primary DC input power to the micro-controller 62 over line 62a. However, in the event of a failure of the AC to DC power supply 58, the secondary DC input power can be provided by the input power source sensor circuit 60 to power the micro-controller 62. In this configuration, the micro-controller 62 can be redundantly powered by either the primary DC input power or the secondary DC input power via the input power source sensor circuit 60.

The input power source sensor circuit 60 can further include circuitry to determine if the input power source sensor circuit 60 is providing power to the micro-controller 62 from the primary or secondary DC input power. In the event that the input power source sensor circuit 60 determines that it is providing the secondary DC input power to the micro-controller, the input power source sensor circuit 60 can communicate with the operator, via the communication-in circuit 64a, to notify the operator that the AC to DC supply 58 has failed.

In one embodiment, the micro-controller 62, which is incorporated in the power management circuitry 50, is a model XA, PXAG49KBA, which can be obtained from Philips, Amsterdam, Netherlands. The micro-controller 62 can receive a sense current signal from the current sensor circuit 52 over line 62b, which represents a proportionate level of current that is drawn by the power strip 10 over the input power line 54.

The micro-controller is further coupled to the communication-in circuit 64a and the communication-out 64b circuit. The communication-in circuit 64a and the communication-out circuit 64b are respectively coupled to the first 26a and second 26b communication ports, which are defined on the external region of the second end 16 of the housing 12. In an embodiment, the communication-in circuit 64a and the communication-out circuit 64b can each include an RS232 communication device. The RS232 communication devices associated with the communicate with circuit 64a and the communication-out circuit 64b can each bi-directionally communicate with the mico-controller 62 over their respective communication lines Tx1, Rx1 and Tx2, Rx2.

The micro-controller 62 is ether coupled to an audible alarm 66 and a mute button 68. The audible alarm 66 alerts an operator, via a speaker 13 (FIG. 2b) mounted on the housing 12, of electrical current on the input power line 54 that exceeds a predetermined threshold value. The operator can silence the alarm 66 by actuating the mute button 68. The micro-controller 62 is also coupled to a non-volatile memory 70, such as an electrically-erasable-programmable-read-only-memory ("EEPROM"). The non-volatile memory 70 can store configuration information as well as power management operating instructions.

An under-voltage sensor circuit 72 is coupled to the micro-controller 62 and can provide a reset signal to the micro-controller 62 over line 62c. More specifically, the under-voltage sensor circuit 72 is adapted to receive a 5-volt value from the AC to DC supply 58. The under-voltage sensor circuit 72 compares the 5-volt value to a predetermined threshold value. If the 5-volt value falls below the predetermined threshold value a reset signal is provided by the under-voltage sensor circuit 72 to the micro-controller 62 over line 62c.

For example, the predetermined under-voltage threshold value can be programmed to 4.6-volts. Thus, if the 5-volt DC voltage provided to the under-voltage sensor circuit 72 by the power supply 58 falls below the under-voltage threshold value of 4.6-volt, a reset signal will be provided to the micro-controller 62 over line 62c. The reset signal can reset the micro-controller 62 or maintain the micro-controller 62 at an idle state until the AC to DC supply 58 provides the under-voltage sensor circuit 72 with a voltage value that exceeds the threshold value or which exceeds the threshold value of 4.6-volts in this example. Maintaining the micro-controller in an idle state, when the 5-volt value provided by the AC to DC power supply is below the threshold, minimizes the micro-controller entering a random logic state.

The micro-controller 62 is further coupled to a relay driver circuit 76. The relay driver circuit 76 is coupled to each relay 56 associated with each of the power outlets 18b. Additionally, the relay driver circuit 76 can provide a control signal to each relay 56, which is associated with each power outlet 18b, to power-on and power-off each power outlet 18b. More precisely, each relay 56 can be individually actuated between a conductive state and a non-conductive state for controllably providing power to each power outlet 18b that is associated with each relay 56. Each power outlet 18b can include an LED 15 that can be controlled to illuminate to indicate to an operator that a particular power outlet 18b is powered-on.

An over load LED 78 can be coupled to the micro-controller 62. The over-load LED 78 can be controlled to illuminate or flash at a predetermined frequency to indicate the operating status of the intelligent power strip 10 to an operator. In one example, the overload LED 78 can be controlled to illuminate a green light when the current drawn over input power line 54 is under a predetermined normal-threshold value. The overload LED 78 can also be controlled to illuminate a green flashing light when the current drawn over input power line 54 is over the normal-threshold value, but below a predetermined overload-threshold value. The overload LED 78 can be further controlled to illuminate a red light when the current drawn over input power line 54 has exceeded the overload-threshold value.

Figure 5:
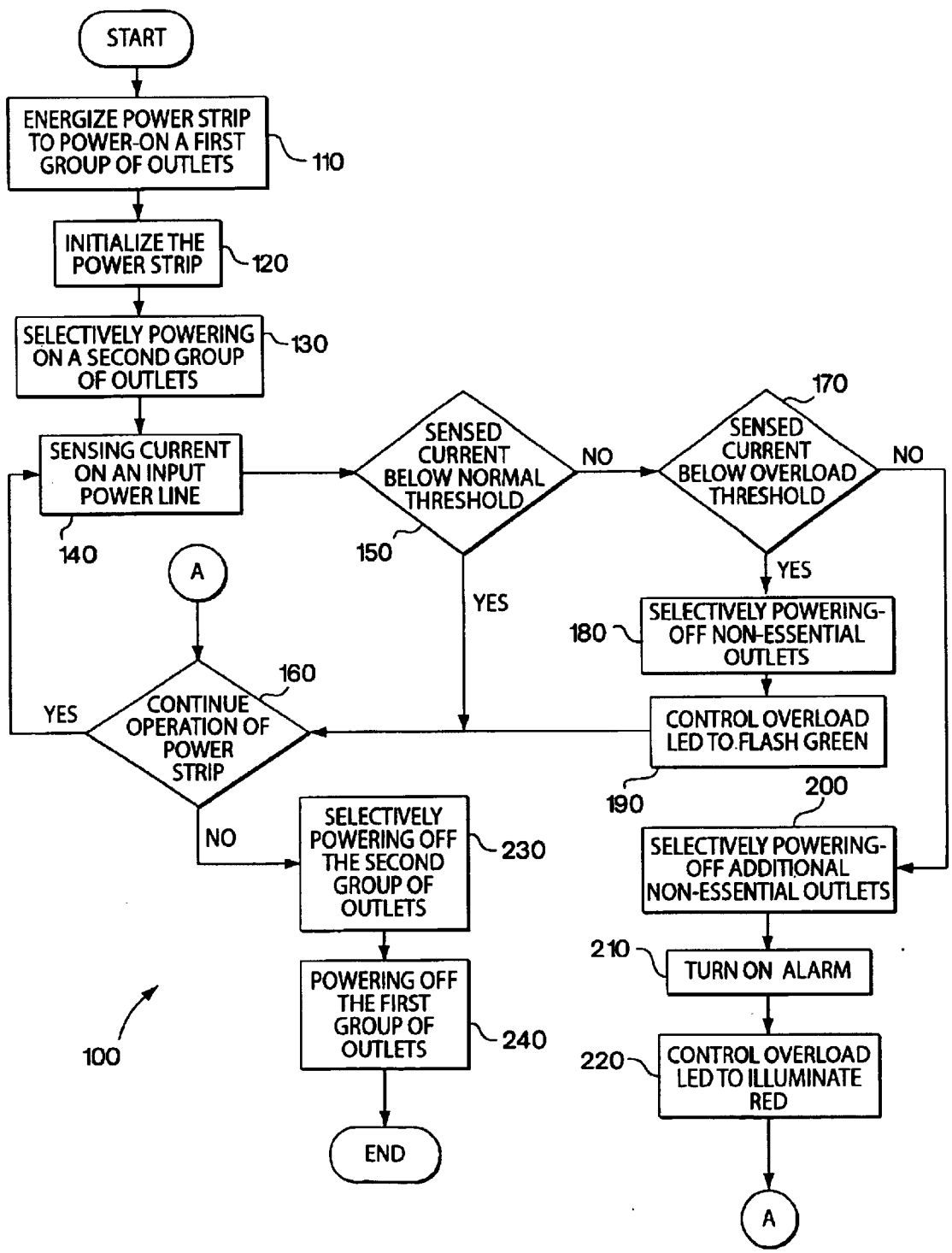
FIG. 5 is a flow chart showing a method of using the power strip shown in FIG. 1.

Referring further to FIG. 5, a method of operating the intelligent power strip 100 can include an operator powering-on the first group of power outlets 18a by applying AC power to the input power line 54 at step 110. Immediately after applying AC power to the AC input power line 54, the first group of power outlets 18a can be powered-on to energize one or more computers 20 or peripheral devices 22 coupled therewith. After applying AC power to the power strip 10, the power strip 10 can be initialized at step 120. In initializing the power strip 10 at step 110, the operator can program the power strip 10 with a number of system parameters and operating configurations. The system parameters and operating configurations can include: a normal-threshold value, an overload-threshold value, an under-voltage threshold value, delays related to powering-on and powering-off the second group power outlets 18b and the sequence for which power outlets 18b can be powered-on and powered-off.

After initializing the power strip at step 120, the second group of power outlets 18b can be selectively powered-on at step 130. The second group of power outlets 18b can be selectively powered-on, at step 130, in accordance with the operator defined sequence and operator defined delays. Similarly, one or more computers 20 and/or peripheral devices 22, which can be coupled to the second group of power outlets 18b can also be powered-on in accordance with the sequence and delays.

After the step of powering-on the second group of outlets at step 130, the method of operating the intelligent power strip further includes sensing current on the power input line 54, at step 140, with the current sense circuit 52. The current values sensed by the current sense circuit 52 are provided to the micro-controller 62 to enable the micro-controller 62 to determine if the normal-threshold value or the overload-threshold value has been exceeded. At step 150, if it is determined that the sensed current on the input power line 54 is below the normal-threshold value, normal operation can continue at step 160. If the micro-controller 62 determines that the current on input power line 62 has exceeded the normal-threshold value at step 150, but is still below the overload-threshold value, as determined at step 170, the micro-controller can provide a control signal over line 76a to instruct the relay driver 76 to actuate one or more relays. At step 180, the relays 56 can be actuated to a non-conductive state to power-off one or more associated power outlets 18b and associated equipment. At step 190, the mico-controller can further control the overload LED 78 to flash a green light to indicate the overload status of the power strip 10.

At step 170, if it is determined that the sensed current on the input power line 54 has exceeded the overload-threshold value, the micro-controller 62 can provide another control signal over line 76a to instruct the relay driver 76 to actuate additional relays 56. At step 200, the additional relays 56 can be actuated to a non-conductive state to power-off additional power outlets 18b as well as associated connected loads. In this manner, one or more power outlets 18b can be powered-off depending on the current sensed on the input power line 54 to minimize branch circuit breaker 82 tripping, which can cause all of the power outlets 18 to power-off. At step 210, the micro-controller 62 can turn on the alarm 66 to alert an operator of the overload status of the power strip 10. At step 220, the micro-controller 62 can further illuminate the overload LED 78 to provide a red light to alert an operator of the overload status of the power strip 10.

At step 160, an operator can elect to power down the power strip 10. The power strip 10 can be powered down by selectively powering-off the second group of power outlets 18b, at step 230. The second group of power outlets 18b can be controlled to power-off in accordance with the operator defined sequence and operator defined delays. Therefore, the second group of power outlets 18b can be sequentially powered-off to sequentially de-energize the one or more computers 20 or peripheral devices 22 coupled to the second group of power outlets 18b. At step 240, the first group of power outlets 18a can be powered-off immediately after removing power from the AC input power line 54, which consequently de-energizes the one or more computers 20 or peripheral devices 22 coupled to the first group of power outlets 18a.

In an embodiment, the operator can further program additional power strip operating parameters such as a maximum current draw on the input power line 54. The maximum current draw value is a percentage of the full load current carrying capacity of power conductors (not shown) defined in the input power line 54. For example, if the input power line includes four copper number 10 American Wire Gauge ("AWG") conductors with type-THHN insulation, the full load current carrying capacity of the conductors will be approximately 30-Amperes. In this example, the operator can program the maximum current drawn over these conductors to be 66 percent of their full load current carrying capacity or approximately 20-Amperes. As a result, when the power strip 10 is initially energized the second group of power outlets 18b can be sequentially energized, provided the sensed current on input power line 54 does not exceed the percentage of the full load current carrying capacity of the power conductors or 20-Amperes in this example. Programming the maximum current drawn on the input power line 54 can prevent thermal stressing of the conductors and avoid damaging the conductors as well as avoid branch circuit breaker 82 tripping.

In other embodiments of the present invention, the power strip 10 can be mounted horizontally in the equipment rack 41 or alternatively, the power strip 10 can be flush mounted on an exterior surface of the equipment rack 41 without departing from the spirit and scope of the present invention. Although not shown, it can be readily understood by those skilled in the art that the power outlets 18 and associated power management circuitry 50 included on the power strip 10 can be adapted for mounting in a portable housing without departing from the spirit and scope of the present invention. For example, the portable housing can include a rectangular, cubical or cylindrically shaped structure that can accommodate the power outlets 18 and power management circuitry 50. In this manner, the principles of the present invention, as described above, can be incorporated into a power distribution system that is easily transportable. Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting.

What is claimed is:

1. A power strip, comprising:
   a housing having a first end and a second end;
   a first group of power outlets and a second group of power outlets mounted on an exterior surface of the housing;
   a power management circuit defined on an interior region of the housing, including:
      a current sensor circuit that is adapted to receive input power over an input power line, the current sensor circuit being coupled to a power supply and to the first group of power outlets;
      a micro-controller coupled to the power supply and to a relay driver, the relay driver receiving control signals from the micro-controller;
      an input power source sensor circuit, coupled intermediate the power supply and the micro-controller, to receive primary input power from the power supply and secondary input power from a secondary power source, whereby the input power source sensor circuit provides the primary input power to the micro-controller and if the primary input power fails, the input power source sensor circuit provides the secondary input power to the micro-controller; and
      a plurality of relays coupled to the relay driver and to the second group of power outlets,
         wherein the relays receive a control signal from the relay driver to actuate the relays to a conductive state to powering-on the power outlets and the relays receive another control signal from the relay driver to actuate the relays to a non-conductive state to powering-off the power outlets; and
   an under voltage sensor coupled to the micro-controller and adapted to receive a predetermined voltage-value from the power supply and being responsive to the predetermined voltage-value falling below a predetermined threshold value by providing a reset signal to the micro-controller.

2. The power strip of claim 1, wherein the power strip further includes a plurality of communication ports.

3. The power strip of claim 2, wherein the communication ports include a first communication port coupled to a communication-in circuit and a second communication port coupled to a communication-out circuit, the communication-in circuit and the communication-out circuit being further coupled to the micro-controller.

4. The power strip of claim 3, wherein the communication-in circuit includes the secondary power source.

5. The power strip of claim 4, wherein the micro-controller is further coupled to a non-volatile memory device.

6. The power strip of claim 5, wherein the micro-controller is further coupled to an audible alarm that can alert an operator that current on the input power line has exceeded a predetermined threshold value.

7. The power strip of claim 6, wherein the micro-controller is further coupled to a mute button that is actuated to silence the audible alarm.

8. The power strip of claim 7, wherein the micro-controller is further coupled to an overload light-emitting-diode which is controlled to illuminate with a predetermined frequency to indicate an overload status of the input power line.

9. The power strip of claim 8, wherein the second group of power outlets includes a plurality of light emitting diodes that can each be controlled to illuminate to indicate that an associated outlet is powered-on.

10. A power distribution method comprising the steps of:
   energizing an input power line to power-up a first group of power outlets on a power distribution system;
   initializing the power distribution system, initializing including the steps of:
      programming a normal-threshold value into the power distribution system;
      programming an overload-threshold value into the power distribution system;
      programming an under-voltage threshold value into the power distribution system; and
   controlling a plurality of relays to actuate to a conductive state in accordance with a predetermined sequence and a predetermined delay to sequentially power-on a second group of power outlets on the power distribution system.

11. The power distribution method of claim 10, wherein initializing further includes the steps of:
   programming delays into the power distribution system, the delays being related to powering-on and powering-off the second group of power outlets; and
   programming the sequence for which the second group of power outlets is powered-on and powered-off.

12. The power distribution method of claim 11, wherein powering-on the second group of power outlets further includes illuminating a plurality of light-emitting-diodes associated with the second group of power outlets.

13. The power distribution method of claim 11, wherein the method further includes programming a maximum current draw value.

14. The power distribution method of claim 11, wherein the method further includes:
   sensing current on the input power line;
   providing the sensed current to a micro-controller; and
   determining if the sensed current is below the normal-threshold value, wherein if the sensed current is below the normal-threshold value, the method further includes indicating a normal operation of the power distribution system.

15. The power distribution method of claim 14, wherein the method further includes the steps of:
   determining if the sensed current is above the normal-threshold value; and
   determining if the sensed current is below the overload-threshold value, wherein if the sensed current is above the normal-threshold value and below the overload-threshold value, the method further includes indicating a high current status of the power distribution system.

16. The power distribution method of claim 15, wherein the method further includes the step of:
   determining if the sensed current is above the overload-threshold value, wherein if the sensed current is above the overload-threshold value, the method further includes indicating an alarm status of the power distribution system.

17. The power distribution method of claim 16, wherein if the sensed current is above the normal-threshold value and below the overload-threshold value, the method further includes controlling a first group of predetermined relays to actuate to a non-conductive state to power-off a number of associated power outlets.

18. The power distribution method of claim 17, wherein if the sensed current is above the overload-threshold value, the method further includes controlling a second group of predetermined relays to actuate to a non-conductive state to power-off a number of associated power outlets.

19. The power distribution method of claim 18, wherein the method further includes:
   controlling the plurality of relays to actuate to a non-conductive state in accordance with a predetermined sequence and a predetermined delay to sequentially power-off the second group of power outlets which are coupled to the relays; and
   de-energizing the input power line defined on the power strip to power-off the first group of power outlets defined on the power strip.

20. A power distribution system, comprising:
   a plurality of power strips, the power strips being mounted in an equipment rack, the equipment rack having a number of slots adapted to securely hold a number of pieces of equipment, each power strip including:
      a housing having a first end and a second end;
      a plurality of power outlets mounted on an exterior surface of the housing;
      a power management circuit defined on an interior region of the housing, including:
         a current sensor circuit that is adapted to receive input power over an input power line, the current sensor circuit being coupled to a power supply and to the power outlets;
         a micro-controller coupled to the power supply and to a relay driver, the relay driver receiving control signals from the micro-controller; and
         a plurality of relays coupled to the relay driver and to the power outlets,
      wherein the relays receive a control signal from the relay driver to actuate the relays to a conductive state to powering-on the power outlets and the relays receive another control signal from the relay driver to actuate the relays to a non-conductive state to powering-off the power outlets.

21. The power distribution system of claim 20, wherein the power strips mounted in the equipment rack are daisy chained together to form a scalable power strip.

22. An intelligent power strip, comprising:
   a housing;
   a first group of power outlets defined on the housing;
   a second group of power outlets defined on the housing;
   a means for controlling power to the first and second groups of power outlets in accordance with a predetermined sequence and a predetermined delay to sequentially power-on the second group of power outlets, the means for controlling including:
      a means for programming the sequence for which the second group of power outlets is powered-on and powered-off; and
      a means for programming delays into the power strip, the delays being related to powering-on and powering-off the second group of power outlets;
   a means for sensing current on the input power line;
   a means for determining if the sensed current is below a normal-threshold value, wherein if the sensed current is below the normal-threshold value, the power strip enables a means for indicating a normal operation of the power strip;
   a means for determining if the sensed current is above the normal-threshold value; and
   a means for determining if the sensed current is below an overload-threshold value, wherein if the sensed current is above the normal-threshold value and below the overload-threshold value, the power strip enables a means for indicating a high current status of the power strip.

23. The intelligent power strip of claim 22, wherein the intelligent power strip further comprises:
   a means for determining if the sensed current is above the overload-threshold value, wherein if the sensed current is above the overload-threshold value, the power strip enables a means for indicating an alarm status of the power strip.

24. The intelligent power strip of claim 23, wherein if the sensed current is above the normal-threshold value and below the overload-threshold value, the power strip further enables a means for controlling a first group of predetermined relays to actuate to a non-conductive state to power-off a number of associated power outlets.

25. The intelligent power strip of claim 24, wherein if the sensed current is above the overload-threshold value, the power strip further enables a means for controlling a second group of predetermined relays to actuate to a non-conductive state to power-off a number of associated power outlets.

26. The intelligent power strip of claim 25, wherein the power strip further includes:
   a means for controlling the plurality of relays to actuate to a non-conductive state in accordance with a predetermined sequence and a predetermined delay to sequentially power-off the second group of power outlets which are coupled to the relays; and
   a means for de-energizing the input power line defined on the power strip to power-off the first group of power outlets defined on the power strip.

* * * * *